United States Patent [19]

Ferrando

[11] Patent Number: 4,988,673

[45] Date of Patent: Jan. 29, 1991

[54] METHOD FOR PRODUCING SILVER COATED SUPERCONDUCTING CERAMIC POWDER

[75] Inventor: William Ferrando, Arlington, Va.

[73] Assignee: The United States of America as represented by the Secretary of the Navy, Washington, D.C.

[21] Appl. No.: 389,220

[22] Filed: Aug. 2, 1989

[51] Int. Cl.$^5$ .......................... H01L 39/12; B05D 5/12
[52] U.S. Cl. .......................................... 505/1; 505/700; 505/725; 505/785; 427/62; 427/123; 427/125; 427/217
[58] Field of Search .................... 505/1, 700, 725, 785, 505/737; 427/62, 63, 123, 125, 217; 428/930

[56] References Cited

U.S. PATENT DOCUMENTS 4,826,808 5/1989 Yurek et al. ............................... 505/1
4,892,861 1/1990 Ray .......................................... 505/1

OTHER PUBLICATIONS

McCallum et al., *Advanced Ceramic Materials*, vol. 2, No. 3B, Jul. 1987, pp. 388–400.

*Primary Examiner*—Norman Morgenstern
*Assistant Examiner*—Margaret Bueker
*Attorney, Agent, or Firm*—Kenneth E. Walden; Roger D. Johnson

[57] ABSTRACT

A process for silver coating superconducting ceramic powder by
(1) coating the superconducting ceramic powder particles with $AgNO_3$;
(2) melting the $AgNO_3$ so that it wets and forms a uniform coating over the surfaces of the particles; and
(3) decomposing the $AgNO_3$ to form a thin, uniform coating of silver metal on the surfaces of the particles.

The product is a loose powder of the superconducting ceramic particles which are uniformly coated with silver metal. The powder can be cold worked (e.g., swaged, forged, etc.) to form superconducting structures such as rods or wires.

15 Claims, 5 Drawing Sheets

Ag COATED

MAG: 5,000 X

MAG: 5,000 x

AS RECEIVED

FIG. 2B  MAG: 5,000 X  Ag COATED

METHOD FOR PRODUCING SILVER COATED SUPERCONDUCTING CERAMIC POWDER

BACKGROUND OF THE INVENTION

This invention relates to metal/ceramic composites and more particularly to silver metal-coated superconducting ceramic powders.

Since the advent of the new generation high Tc (~77° K.) ceramic superconducting materials, prodigious efforts have been expended to fabricate same into usable wire form.

The relative metallurgical intractability of these ceramic compounds has been described as follows:

> "... They are reactive, unstable, brittle, unable to support any significant stress; unable to be formed and reprocessed, and not easily joined. The powder form of the compound used as the raw material for the fabrication process is itself not easily produced with consistency."
> "There is a great deal of uncertainty about compositions and structures which superconduct (and remain superconducting after processing), but clearly, in the new materials, oxygen stoichiometry and oxygen partial pressure during processing are crucial. Attempts to combine these powders with metal-matrix support systems such as copper have been unsuccessful because elevated-temperature fabrication in the rich oxygen environment these powders require causes rapid oxidation of the metals and rapid degradation of the powder, including oxygen depletion of the superconducting lattice."
> [Murr, L.E. Hare, A.W., Eror, N.G. "Introducting: The Metal-Matrix High-Temperature Superconductor," Advanced Materials & Processes, Inc., Metal Progress 10/87.]

It would be desirable to provide a process by which intimate bonding of the superconductive ceramic particles with a suitable workable metal of good electrical conductivity is achieved while maintaining the superconductive properties of the ceramic.

SUMMARY OF THE INVENTION

Accordingly, an object of this invention is to provide a new method of incorporating superconducting ceramics into a workable metal matrix without loss of the superconductive properties.

Another object of this invention is to produce a new superconductive composite powder capable of being worked by techniques such as forging, swaging, drawing, etc.

A further object of this invention is to provide a composite powder in which the superconducting ceramic particles are protected against chemical degradation.

These and other objects of this invention are achieved by providing a process for silver coating superconducting ceramic powders comprising:

(1) coating superconducting ceramic powder particles with $AgNO_3$;

(2) melting the $AgNO_3$ so that it wets and forms a uniform coating over the surfaces of the particles; and (3) decomposing the $AgNO_3$ to form a thin, uniform coating of silver metal on the surfaces of the particles.

The product is a loose powder of superconducting ceramic particles which are uniformly coated with silver metal. The powder can be cold worked (e.g., swaged, forged, etc.) to form superconducting structures such as rods or wires.

BRIEF DESCRIPTION OF FIGURES

A more complete understanding of the invention and many of the attendant advantages thereto will be readily appreciated as the same becomes better understood by reference to the following detailed description when consider in connection with the accompanying figures wherein:

FIGS. 1A, 1B, and 1C show powder X-ray spectra for silver metal coated $YBa_2Cu_3O_{7-x}$ powder composites containing (A) 14.6, (B) 7.9, and (C) 2.09 weight percent silver and is discussed in example 1;

DETAILED DESCRIPTION OF THE PREFERRED EMBODIMENT

Figure 1A:
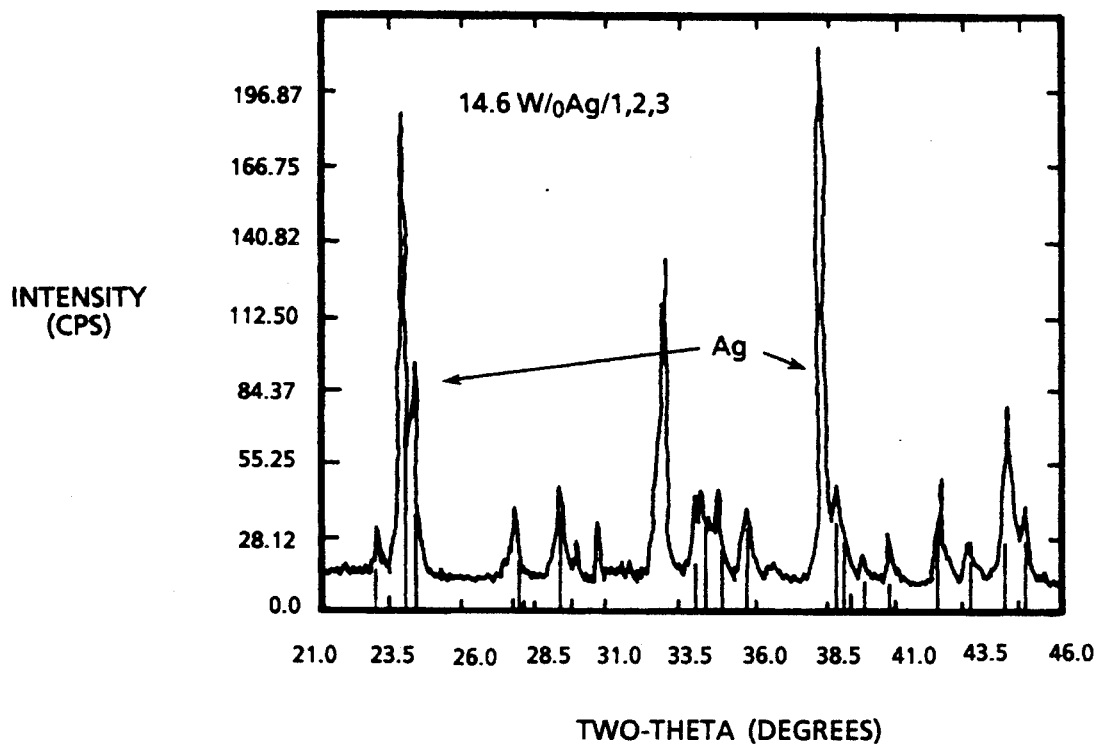

The process of this invention quickly and inexpensively produces uniform, thin coatings of silver metal on particles of ceramic superconductors. The process operates at temperatures well below the melting points of the ceramic materials and leaves their superconducting properties undisturbed. These silver metal coated particles have good cold working properties and may be swaged, drawn, pressed, etc., to form wires, rods, or other useful forms. In contrast to the brittle ceramics, the silver matrix or coating produces a flexible, malleable material. The uniform silver metal coating also provides some protection for the superconductor material against the environment.

The key to the present process is the special properties of $AgNO_3$. At 212° C. silver nitrate melts and forms a clear, low viscosity liquid with excellent wetting properties. The molten $AgNO_3$ quickly spreads out to form a uniform coating on the surfaces of the ceramic particles. Moreover, the silver nitrate decomposes at 444° C. leaving a thin, uniform coating of silver metal. Note that this decomposition temperature of silver nitrate is more than 500° C. below the melting point of $YBa_2Cu_3O_{7-x}$. Similarly, it is well below the melting point of the other superconducting ceramics.

Reagent (ACS) grade $AgNO_3$ is preferred for this process. Less pure $AgNO_3$ may introduce undesirable impurities.

This process is designed for use on ceramic superconductors. For example, it can be used to coat yttrium (Y) based ceramic superconductors such as $YBa_2Cu_3O_{7-x}$, bismuth (Bi) based ceramic superconductors such as $Bi_{.7}Pb_{.3}SrCaCu_{1.8}Ox$, and thallium (Tl) based superconductors such as $Tl_2Ba_2Ca_2Cu_3O_{7-x}$. Molten $AgNO_3$ does not chemically attack or adversely affect these ceramic superconductors. In fact, because $AgNO_3$ is an oxidizer, it helps to maintain the oxygen content in these ceramics.

The products of the process are loose powders made up of ceramic particles which are uniformly coated with silver metal. This powder composite product is composed of from about 1 to about 25, and preferably from 1 to 15, and more preferably from 10 to 15 weight percent of silver metal with the ceramic superconducting material being the remainder of the composite.

The amounts of $AgNO_3$ and superconducting ceramic powder in the starting mixture are calculated as follows. The amount of silver metal needed is calculated from the amount of superconducting ceramic powder to be coated and the desired silver metal/ceramic composition. The weight of $AgNO_3$ to be used in the starting mixture is then calculated by multiplying the weight of silver metal needed by 1.5748 (mol. wt. $AgNO_3$ divided by at. wt. Ag).

The first step of the process is to coat the superconducting ceramic particles with the $AgNO_3$ If the silver metal/ceramic composite is to contain 10 to 25 weight percent of silver, the $AgNO_3$ may be melted and the ceramic particles mixed in until they are wetted. Or the $AgNO_3$ powder and the superconducting particles may be mixed together before the $AgNO_3$ is melted. However, if the silver metal content is to be less than 10 weight percent, it will be difficult if not impossible to wet all the ceramic particles in the amount of molten $AgNO_3$ available.

A procedure that will work for the entire range of from about 1 to about 25 weight percent silver is to dissolve the $AgNO_3$ in a suitable solvent. Just enough of the solvent is used to make a paste that assures the wetting of all ceramic particle surfaces with the $AgNO_3$ solution. The solvent is then removed, leaving the $AgNO_3$ deposited as small crystals over the surfaces of the particles. Note that a suitable solvent is one that (1) dissolves $AgNO_3$, (2) can be evaporated at relatively low temperatures without leaving a residue, and (3) will not react with or damage the superconducting ceramic. Distilled water ($AgNO_3$ solubility about 120 g/100 ml at 0° C.) will work well for bismuth or thallium based superconducting ceramics. However, water damages $YBa_2Cu_3O_{7-x}$. Ethylene glycol, $HOCH_2CH_2OH$, ($AgNO_3$ solubility about 75 g/100 ml) is the solvent of choice. It is safe for superconducting ceramics (including $YBa2Cu3O_{7-x}$). However, care must be taken in removing the ethylene glycol. The temperature should be kept below 75° C. and preferably should be in the range of from 50° C. to 65° C. At high temperatures the ethylene glycol acts as fuel and may catch fire.

In the second step of the process, the $AgNO_3$ is heated at a temperature above its melting point (212° C.) and below its decomposition temperature (444° C.) until it melts and wets the superconducting ceramic particle surfaces. As a practical matter, this occurs automatically while the $AgNO_3$ coated particles are being heated up to the $AgNO_3$ decomposition temperature. When the small $AgNO_3$ crystals melt on a particle, the molten $AgNO_3$ seeks to cover as wide an area as possible. As a result, the $AgNO_3$ wets the particle surface forming a uniform coating.

In the third and final step of the process, the $AgNO_3$ is decomposed to form a thin, uniform coating of silver metal over the surfaces of the superconducting ceramic particles. The reaction sequence is:

$$AgNO_3 \rightarrow AgO + NO_2$$

$$2AgO \rightarrow 2Ag + O_2.$$

The decomposition step may be run at a temperature of from the decomposition temperature of $AgNO_3$ (444° C.) up to 50° C. less than the melting point of the superconducting ceramic. As a practical matter there is no need to use very high temperatures. A preferred temperature range from the decomposition step is from 450° C. to 550° C., with from 450° C. to 500° C. being more preferred. After the decomposition is complete, the coated particles are cooled to room temperature.

The silver metal-coated superconducting particles produced are in the form of a loose powder. In contrast to silver coating produced from mixtures of fine silver powder and the superconducting ceramic powder, the coating produced by this process are smooth and uniform. Agglomeration of the silver coated ceramic particles may occur when the silver metal content of the composite is near 25 weight percent. This can be correcting by ball milling to break the particles apart. This creates jagged uneven spots in the silver metal coating. However, because silver metal is soft, the ball milling process smooths and reforms the silver coatings.

Silver metal-coated particles produced by this process have been used to produce superconducting pellets by pressing. They also have been used to produce rods and wires by packing in copper or silver tubes and swaging. Explosive compaction and extrusion have been attempted.

The silver metal-coated superconducting particles produced by this process are characterized by uniform coatings which are preferably from about 0.02 to about 10 microns thick, and more preferably from 0.05 to 1 micron thick.

Chemical vapor deposited coatings on such powders, if available, should look similar. However the penetration of silver into the small cavities of individual particles (see FIGS. 2A and 2B might not be as complete. This is simply speculation because such powders are unavailable and if tried would be very expensive to manufacture.

The general nature of the invention having been set forth, the following examples are presented as specific illustrations thereof. It will be understood that the invention is not limited to these specific examples but is susceptible to various modifications that will be recognized by one of ordinary skill in the art.

EXAMPLE 1

The described method was used to produce Ag Coated $YBa_2Cu_3O_{7-x}$ (123) high temperature superconducting (HTS) powder in various weight percentages of silver. The steps in accomplishing this are given as follows:

(a) 7.5 grams of $AgNO_3$ were dissolved into 10 grams of ethylene glycol.

(b) A 4 gram portion of this solution was thoroughly mixed into 10 grams of 123 HTS powder to form a paste. The glycol carrier was carefully evaporated leaving the 123/$AgNO_3$ mixture. This mixture was heated to 450° C. in air in an oven for 20 minutes to decompose the $AgNO_3$. The total sample weight after decomposition, 11.714 grams, indicated a weight fraction of silver of 1.714/11.714 = 14.6%.

(c) The remainder of the original $AgNO_3$ glycol solution was diluted 2:1 with additional glycol. Following the same procedure as in (b) produced a measured weight of 10.857 grams. The fraction of silver was 0.857/10.857=7.9%.

Figure 1B:
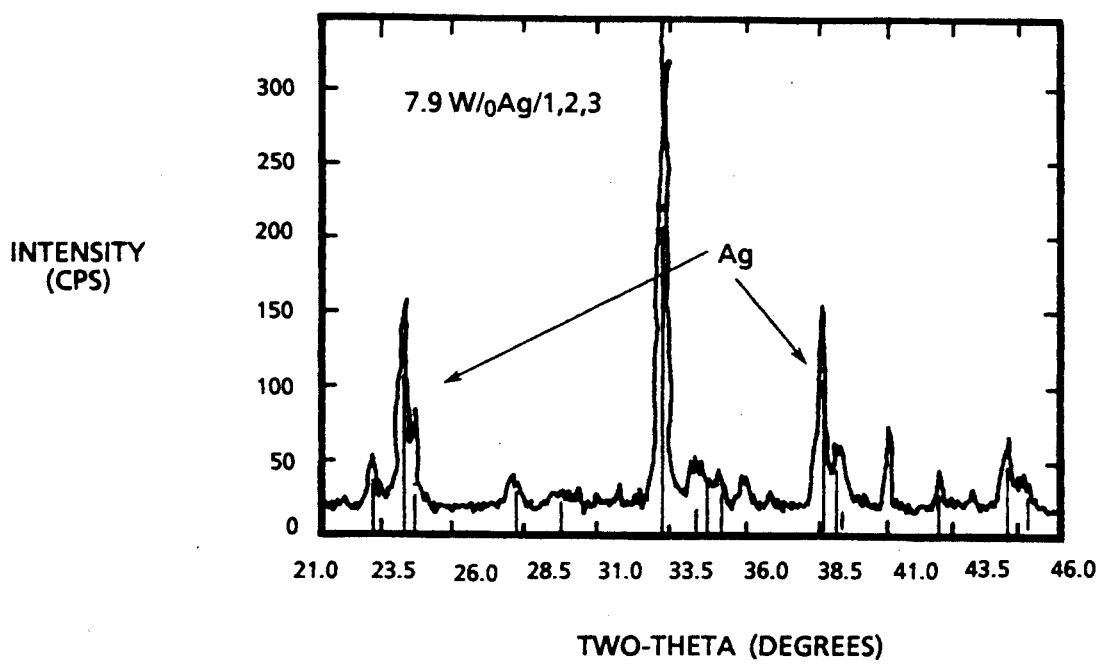

(d) Further dilution following the same procedure produced silver fractions of 4.1% and 2.09%, respectively. Visual inspection and X-ray spectroscopy indicated a quite uniform distribution of the silver. Powder X-ray spectra of the 14.6%, 7 9% and 2.09% samples are shown in FIGS. 1A, 1B, and 1C, respectively. The progressive growth of the Ag peaks are indicated.

EXAMPLE 2

A quantity of $YBa_2Cu_3O_{7-x}$ (123) high temperature superconducting (HTS) powder was coated with 15 weight % silver by applying the method as follows:

(a) 20 grams of 123 HTS powder was weighed. The proportion $0.15=X/(20+X)$ was used to compute the amount of Ag necessary in the sample. This was 3.53 grams. The corresponding amount of $AgNO_3$ required for this weight of Ag after decomposition is obtained from the fraction of molecular weight $108/170=3.53/X$. $X=5.55$ grams $AgNO_3$.

(b) The mixture was heated to about 250° C. on a hot plate while stirring to wet thoroughly the entire body of powder with the liquid $AgNO_3$. The sample was placed subsequently in a furnace in air at ~460° C. for 20 minutes to decompose the $AgNO_3$.

Figure 2B:
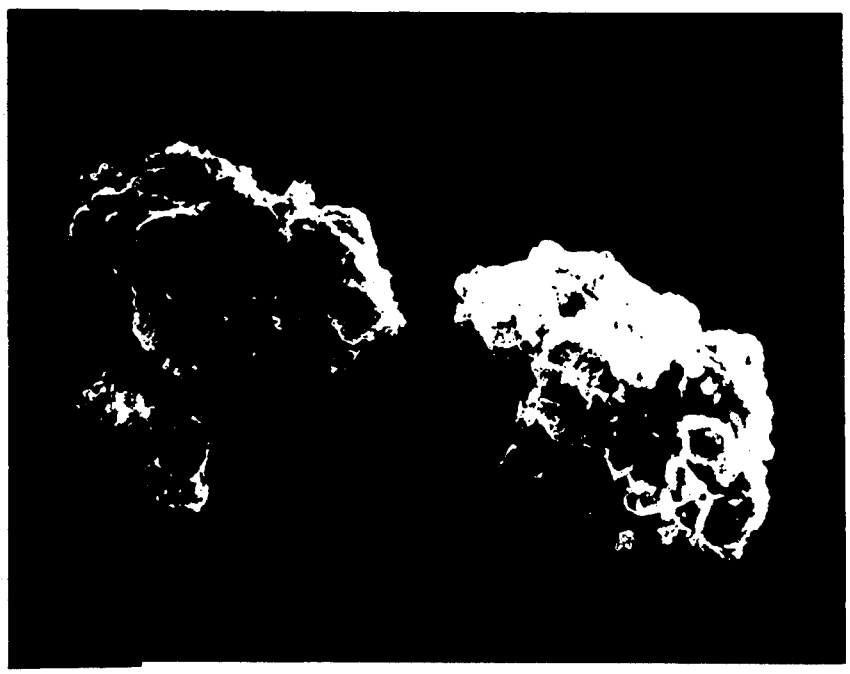
FIGS. 2A and 2B present SEM photographs (5000X) of uncoated (FIG. 2A) and silver metal coated (FIG. 2B) particles of $YBa_2Cu_3O_{7-x}$ high temperature superconducting ceramic powder and are discussed in example 2.
Figure 2A:
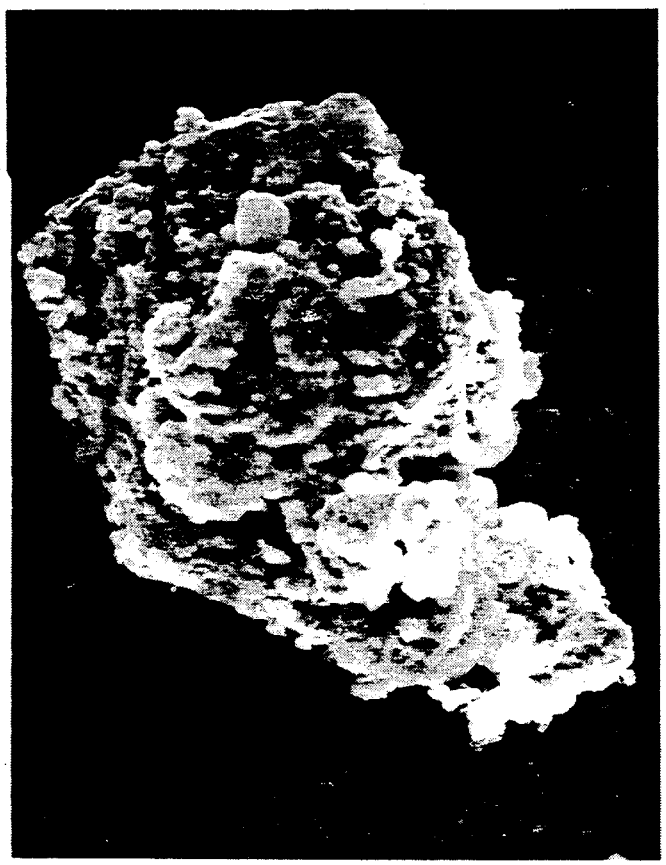

(c) The final product appeared uniform in Ag coating by microscopic observation. FIG. 2A shows a scanning electron microscope (SEM) photograph of the uncoated, as received particles of 123 HTS powder (MAG:5000X) and FIG. 2B shows a SEM photograph of the Ag metal coated particles of 123 HTS powder (MAG:5000X). A notable feature is the filling of micropores observable in the uncoated particles (FIG. 2A) by a smooth layer of silver metal (FIG. 2B).

EXAMPLE 3

Approximately 10 grams of 15% 123/Ag powder (example 2) was packed into a ⅜" outside diameter (OD) 0.030" wall silver tube and swaged down to 0.155 inch. The silver tube was removed from a portion of the tube by grinding.

The removed portion of HTS 123/Ag rod was annealed in $O_2$ atmosphere overnight at 925° C. and subsequently tested for superconducting properties. It was found to have a superconducting transition temperature Tc ≈93° C. and a superconducting current density capability (Tc) of 125 amps/cm².

Figure 3:
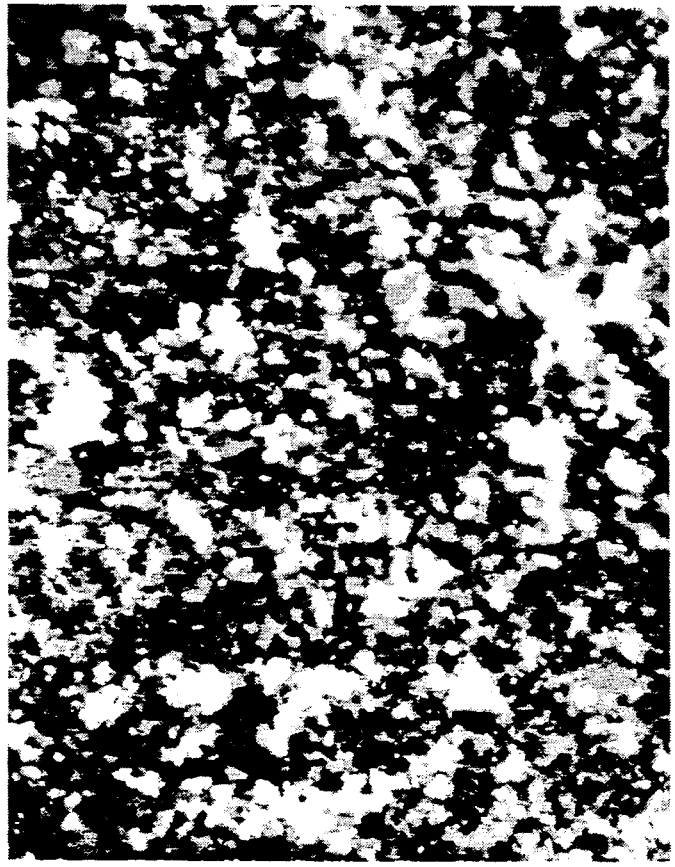
FIG. 3 is an optical micrograph at 400X magnification of a consolidated composite wire cross section morphology wherein the wire was form according to the process of example 3 from the silver coated ceramic particles (FIG. 2B) of example 2.

The optical micrograph (FIG. 3) at 400X magnification shows the consolidated composite wire cross section morphology under these conditons of processing.

Obviously, numerous modifications and variations of the present invention are possible in light of the above teachings. It is therefore to be understood that within the scope of the appended claims the invention may be practiced otherwise than as specifically described herein.

What is claimed is:

1. A process for coating superconducting ceramic powders with silver metal comprising:
   (1) coating superconducting ceramic powder particles with $AgNO_3$;
   (2) heating the $AgNO_3$-coated superconducting ceramic powder at a temperature above the melting point of $AgNO_3$ but below the decomposition temperature of $AgNO_3$ until the $AgNO_3$ melts and forms a uniform coating over the surfaces of the superconducting ceramic particles; and
   (3) heating the molten $AgNO_3$-coated superconducting ceramic powder at a temperature from the decomposition temperature of $AgNO_3$ to 50° C. below the melting point of the superconducting ceramic powder until the $AgNO_3$ decomposes to form a thin, uniform coating of silver metal over the surfaces of the superconducting ceramic powder particles;
   wherein an amount of $AgNO_3$ is used in step (1) which will produce upon decomposition a silver metal coated superconducting ceramic powder composite comprising from about 1 to about 25 weight percent silver metal with the remainder being the superconducting ceramic.

2. The process of claim 1 wherein the superconducting ceramic is a yttrium based superconducting ceramic.

3. The process of claim 2 wherein the superconducting ceramic is $YBa_2Cu_3O_{7-x}$.

4. The process of claim 1 wherein the superconducting ceramic is a bismuth based superconducting ceramic.

5. The process of claim 4 wherein the superconducting ceramic is $Bi_{.7}Pb_{.3}SrCaCu_{1.8}O_x$.

6. The process of claim 1 wherein the superconducting ceramic is a thallium based superconducting ceramic.

7. The process of claim 6 wherein the superconducting ceramic is $Tl_2Ba_2Ca_2Cu_3O_{7-x}$.

8. The process of claim 1 wherein an amount of $AgNO_3$ is used in step (1) which will produce upon decomposition a silver metal coated superconducting ceramic powder composite comprising from 1 to 15 weight percent of silver metal with the remainder being the superconducting ceramic.

9. The process of claim 8 wherein the amount of $AgNO_3$ used in step (1) produces upon decomposition a silver metal coated superconducting ceramic powder composite comprising from 10 to 15 weight percent of silver with the remainder being the superconducting ceramic.

10. The process of claim 1 wherein the molten $AgNO_3$-coated superconducting ceramic powder is heated in step (3) at a temperature of from 450° C. to 550° C. until the $AgNO_3$ decomposes to form a thin, uniform coating of silver metal over the surfaces of the superconducting ceramic particles.

11. The process of claim 10 wherein the temperature used in step (3) is in the range of from 450° C. to 500° C.

12. The process of claim 1 wherein in step (1) the superconducting ceramic powder is thoroughly wetted with molten $AgNO_3$ provided that the amount of $AgNO_3$ used is sufficient to produce a silver metal coated superconducting ceramic powder composite containing from 10 to 25 weight percent silver.

13. The process of claim 1 wherein in step (1) the superconducting ceramic powder is wetted with a solution of the $AgNO_3$ dissolved in an amount of a suitable solvent just sufficient to thoroughly wet the superconducting ceramic powder and then the solvent is removed to leave small crystals of $AgNO_3$ deposited on the surfaces of the superconducting ceramic powder particles.

14. The process of claim 13 wherein the solvent is ethylene glycol.

15. The process of claim 13 wherein the solvent is distilled water provided that the superconducting ceramic is not a yttrium based superconducting ceramic.

* * * * *